United States Patent
Kim et al.

(10) Patent No.: US 6,999,012 B2
(45) Date of Patent: Feb. 14, 2006

(54) TEMPERATURE COMPENSATION DEVICE FOR AUTOMATIC GAIN CONTROL LOOP

(75) Inventors: Seung-Hwan Kim, Suwon-si (KR); Hyung-Weon Park, Suwon-si (KR)

(73) Assignee: Samsung Electronics Co., Ltd., (KR)

( * ) Notice: Subject to any disclaimer, the term of this patent is extended or adjusted under 35 U.S.C. 154(b) by 0 days.

(21) Appl. No.: 10/912,664

(22) Filed: Aug. 5, 2004

(65) Prior Publication Data

US 2005/0073450 A1     Apr. 7, 2005

(30) Foreign Application Priority Data

Oct. 2, 2003  (KR)  ................ 10-2003-0068780

(51) Int. Cl.
  *H03M 1/06*    (2006.01)
(52) U.S. Cl. .................... 341/119; 341/118
(58) Field of Classification Search ............ 341/118, 341/119, 120, 155–172
  See application file for complete search history.

(56) References Cited

U.S. PATENT DOCUMENTS

| | | | |
|---|---|---|---|
| 4,008,617 A * | 2/1977 | Yen et al. ............... | 374/169 |
| 4,168,492 A * | 9/1979 | Uya ........................ | 341/119 |
| 5,081,713 A * | 1/1992 | Miyazaki ................ | 455/76 |
| 5,488,368 A * | 1/1996 | Brown et al. ........... | 341/119 |
| 5,832,373 A * | 11/1998 | Nakanishi et al. ...... | 455/126 |
| 5,982,824 A * | 11/1999 | Ann ....................... | 375/345 |
| 2002/0173284 A1 * | 11/2002 | Forrester ................ | 455/255 |

* cited by examiner

*Primary Examiner*—Linh Van Nguyen
(74) *Attorney, Agent, or Firm*—Dilworth & Barrese, LLP

(57) ABSTRACT

A temperature compensation device for an automatic gain control loop in a receiver of a mobile communication terminal is disclosed. The temperature compensation device comprises a thermistor having a resistance varying with temperature to vary its output voltage, an analog/digital converter for converting the output voltage from the thermistor into a digital signal, and a temperature compensator for outputting a temperature compensation value in response to a digital signal based on a specific temperature variation from the analog/digital converter.

2 Claims, 3 Drawing Sheets

TEMPERATURE COMPENSATION DEVICE FOR AUTOMATIC GAIN CONTROL LOOP

This application claims priority to an application entitled "TEMPERATURE COMPENSATION DEVICE FOR AUTOMATIC GAIN CONTROL LOOP", filed in the Korean Intellectual Property Office on Oct. 2, 2003 and assigned Serial No. 2003-68780, the contents of which are hereby incorporated by reference.

BACKGROUND OF THE INVENTION

1. Field of the Invention

The present invention relates to a temperature compensation device for an automatic gain control loop used in a wireless communication unit.

2. Description of the Related Art

In general, a mobile communication terminal measures the strength of a received signal, and reduces or increases the gain of an amplifier if the measured strength is found to increase or decrease, respectively, to maintain received power at a desired level. The terminal also determines the strength of a signal to be transmitted depending on the received signal strength.

FIG. 1 is a block diagram showing an example of a conventional receiver of a mobile communication terminal. As shown in this drawing, a radio frequency (RF) signal received through an antenna is converted into a digital signal through a low-noise amplifier (LNA) 101, band pass filter (BPF) 102, frequency mixer 103 and analog/digital converter (ADC) 104. The digital signal from the ADC 104 is applied to an energy detector 106, which measures the strength of the received signal from the applied digital signal. The energy detector 106 then adjusts the gain of a digital variable gain amplifier (DVGA) 105 through a gain determiner 107 such that the received signal strength becomes a desired signal level. The gain determiner 107 also adjusts the gains of the LNA 101 and frequency mixer 103 according to the received signal strength.

FIG. 2 is a block diagram showing another example of the conventional receiver of the mobile communication terminal. As shown in this drawing, an RF signal received through an antenna is converted into a digital signal through an LNA 201, BPF 202, frequency mixer 203 and ADC 205. The digital signal from the ADC 205 is applied to an energy detector 206. The energy detector 206 measures the strength of the received signal from the digital signal applied from the ADC 205. The energy detector 206 then adjusts the gain of the automatic gain controller (AGC) 204 through a gain determiner 208 such that the received signal strength achieves a desired signal level. Note that the AGC 204 must be controlled by an analog signal since it is an analog device. In this connection, a gain adjustment signal from the gain determiner 208 is converted into an analog signal through a pulse density modulation (PDM) generator or a digital/analog converter (ADC) 207 and is then applied to the AGC 204 to adjust the gain thereof. The gain determiner 208 also adjusts the gains of the LNA 201 and frequency mixer 203 according to the received signal strength.

As mentioned above, it is necessary to accurately measure the strength of a received signal in conventional mobile communication terminals. However, the amount of gain or loss of each component in the receiver of the mobile communication terminal varies with temperature, resulting in errors in the measured signal strength.

Recently, direct conversion type chips, which can directly convert a received signal into a baseband signal without using an intermediate frequency, are being used in receivers of mobile communication terminals. In this case, in order to secure a dynamic range of the receiver, a number of gain adjustment components, such as a low-noise amplifier, frequency mixer, baseband variable gain amplifier, etc., are used and a number of gain adjustments are made with variations in the received signal strength. As a result, because the various components will provide differing gain as the temperature varies, errors may occur in the measurement of the received signal strength, resulting in generation of an inappropriate gain adjustment signal and, in turn, deterioration of transmitter and receiver characteristics.

SUMMARY OF THE INVENTION

Therefore, the present invention has been made in view of the above problems, and it is an object of the present invention to provide a temperature compensation device for an automatic gain control loop which is capable of, even though temperature varies in a mobile communication terminal, compensating for the temperature variation to accurately measure the strength of a received signal and control the gain of each component according to a result of the measurement.

In accordance with the present invention, the above and other objects can be accomplished by providing a temperature compensation device for an automatic gain control loop in a receiver of a mobile communication terminal, comprising: a thermistor having a resistance varying with temperature to vary its output voltage; an analog/digital converter for converting the output voltage from the thermistor into a digital signal; and a temperature compensator for outputting a temperature compensation value in response to a digital signal based on a specific temperature variation from the analog/digital converter.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

Now, preferred embodiments of the present invention will be described in detail with reference to the annexed drawings. In the following description, a detailed description of known functions and configurations incorporated herein will be omitted to avoid making the subject matter of the present invention unclear.

Figure 1:
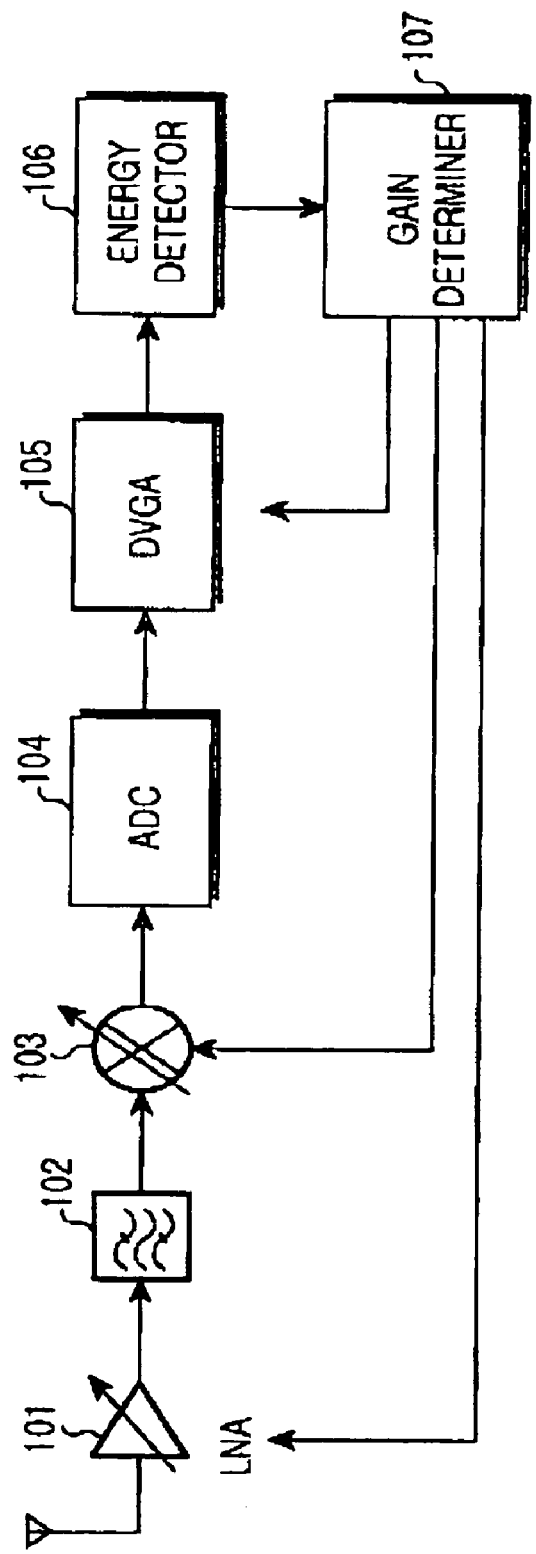
FIG. 1 is a block diagram showing an example of a conventional receiver of a mobile communication terminal.
Figure 2:
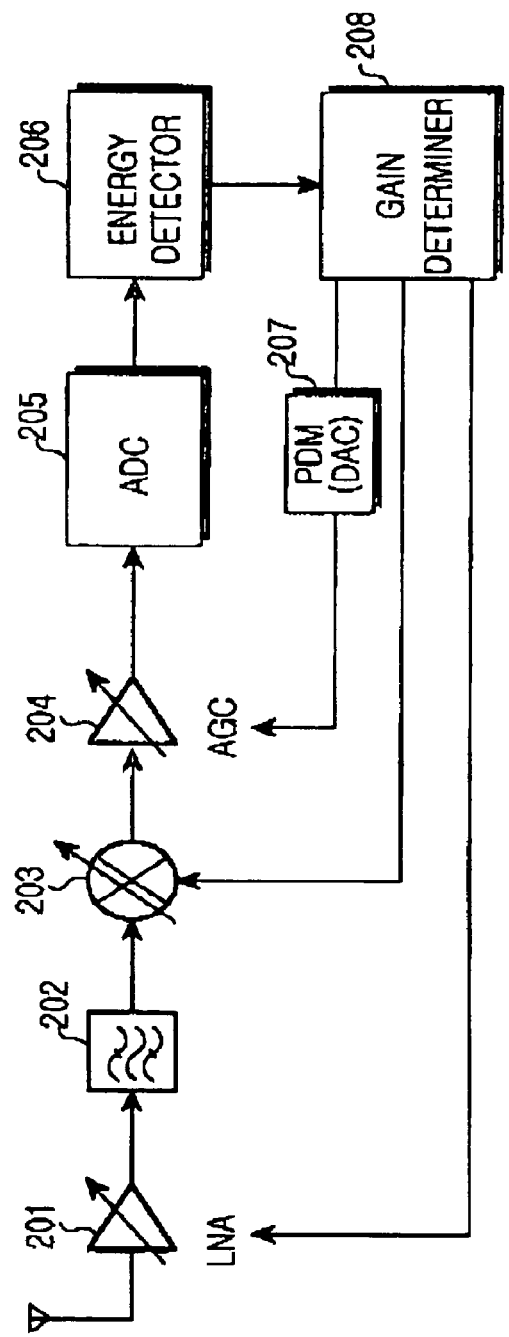
FIG. 2 is a block diagram showing another example of the conventional receiver of the mobile communication terminal.
Figure 3:
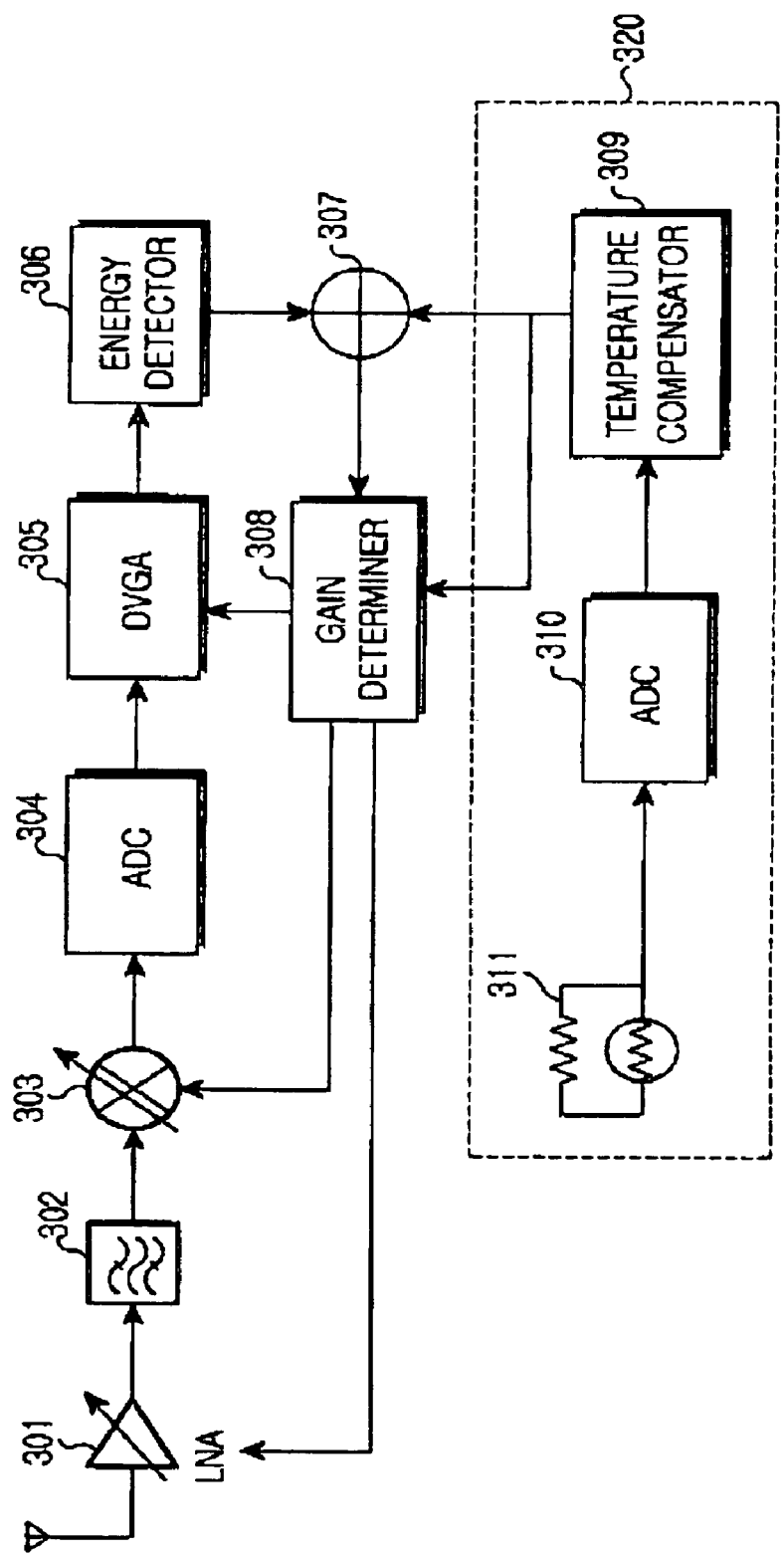
FIG. 3 is a block diagram showing the configuration of a receiver of a mobile communication terminal in accordance with the present invention.

With reference to FIG. 3, there is shown in block form the configuration of a receiver of a mobile communication terminal in accordance with the present invention. As shown in FIG. 3, the receiver according to the present invention comprises an LNA 301 for low-noise amplifying a signal received through an antenna, a BPF 302 for filtering an output signal from the LNA 301 at an available frequency band, a frequency mixer 303 for demodulating an output signal from the BPF 302, an ADC 304 for performing analog to digital conversion of an output signal from the frequency mixer 303, a DVGA 305 for varying an amplification gain for the received signal, an energy detector 306 for measuring the strength of the received signal, and a gain determiner 308 for generating a gain adjustment signal.

The receiver of the mobile communication terminal according to the present invention further comprises a temperature compensation device 320 for an automatic gain control loop. The temperature compensation device 320 includes a thermistor 311 for sensing temperature to enable temperature compensation, an ADC 310 for converting an analog signal from the thermistor 311 into a digital signal, and a temperature compensator 309 for performing a temperature compensation function. Further installed in the receiver is an adder 307, which receives an output signal from the temperature compensator 309 of the temperature compensation device 320 and an output signal from the energy detector 306 as input signals thereto. The adder 307 adds a temperature compensation value from the temperature compensator 309 and a received signal energy value from the energy detector 306. The temperature compensation value from the temperature compensator 309 is also applied to the gain determiner 308 such that the gain determiner 308 can adjust the gain of each component with temperature variations. The temperature compensator 309 can also control a threshold value of the gain determiner 308.

A detailed description is provided below of the operation of the receiver of the mobile communication terminal and the temperature compensation device for the automatic gain control loop according to the present invention. As shown in FIG. 3, an RF signal received through the antenna is transferred to the LNA 301. The LNA 301 low-noise amplifies the RF signal received through the antenna at a corresponding input amplification gain and outputs the resulting signal to the BPF 302. The BPF 302 filters the output signal from the LNA 301 at the available frequency band and outputs the resulting signal to the frequency mixer 303.

The frequency mixer 303 mixes the output signal from the BPF 302 with an oscillation frequency signal from an oscillator (not shown) and outputs the resulting signal to the ADC 304. The frequency mixer 303 acts to frequency down-convert the received RF signal into an intermediate frequency signal. The ADC 304 performs analog to digital conversion of the output signal from the frequency mixer 303 and outputs the resulting digital signal to the DVGA 305. The DVGA 305 amplifies the digital output signal from the ADC 304 at a predetermined gain and outputs the resulting digital signal to the energy detector 306. The energy detector 306 measures the strength of the digital output signal from the DVGA 305 and outputs the measurement result to the adder 307.

As stated above, an RF signal received by the antenna is converted into a digital signal through the LNA 301, BPF 302, frequency mixer 303 and ADC 304. This digital signal is amplified by the DVGA 305, with the strength thereof represented as a digital value by the energy detector 306. The gain determiner 308 determines the gain of the DVGA 305 according to the digitized received signal strength. The gain determiner 308 also determines the gains of the LNA 301 and frequency mixer 303. The LNA 301 and frequency mixer 303 each generally have two gain states (high and low gain states) or three gain states (high, middle and low gain states). For example, the LNA 301 and frequency mixer 303 each enter the high gain state if the received signal strength is lower than a threshold value and the low gain state if it is higher than the threshold value. This threshold value is controlled by the temperature compensator 309.

The thermistor 311 is used to detect a temperature variation. The thermistor 311 is a device whose resistance varies with temperature, outputs a voltage that varies with such resistance, and provides the resulting voltage to the ADC 310. The ADC 310 converts an analog voltage from the thermistor 311 into a digital signal. That is, the temperature variation detected by the thermistor 311 is converted into a digital value by the ADC 310. This digital value based on the temperature variation is applied to the temperature compensator 309. The temperature compensator 309 calculates an appropriate temperature compensation value from the digital value based on the temperature variation. The temperature compensator 309 includes a database having data regarding gain variations of RF devices and analog devices with various temperature variations. The temperature compensator 309 may also control a gain change threshold value of the gain determiner 308 according to the temperature variation.

The temperature compensation is preferably made in one of two ways according to the present invention, as described below.

The first way to perform temperature compensation is to compensate the strength of a received signal. If temperature varies, the resistance of the thermistor 311 varies, thus varying the input voltage to the ADC 310. The input voltage to the ADC 310 is analog/digital converted and outputted to the temperature compensator 309. The temperature compensator 309 provides a digital signal based on the temperature variation to the adder 307. As stated previously, a digital signal representative of the received signal strength from the energy detector 306 is also inputted to the adder 307. As a result, inputted to the adder 307 are the digital signal based on the temperature variation from the temperature compensator 309 and the digital signal based on the received signal strength from the energy detector 306. Then, the adder 307 adds the digital value based on the temperature variation to the digital value based on the received signal strength to correct an error based on the temperature variation in the received signal strength, and outputs the resulting accurate received signal strength to the gain determiner 308. The gain determiner 308 determines the gain of each component on the basis of the accurate received signal strength.

The second way to perform temperature compensation is to compensate a gain change threshold value. Upon receiving a digital value based on a temperature variation, the temperature compensator 309 determines a temperature compensation value on the basis of the temperature variation. In detail, the temperature compensator 309 has gain change threshold values corresponding respectively to various temperature variations and, upon receiving the digital value based on the temperature variation, outputs one of the gain change threshold values corresponding to the temperature variation as the temperature compensation value to the gain determiner 308.

In this manner, in the second above described way to perform temperature compensation, the temperature compensator 309 provides the corresponding gain change threshold value to the gain determiner 308 directly, not via the adder 307. The gain determiner 308 changes the gain of each component on the basis of the gain change threshold value stored in the temperature compensator 309. In other words, the temperature compensator 309 controls the threshold value for changing the gain of each of the various receiver components with temperature, to allow the received signal strength to be used directly, without compensation for temperature. In this manner, it is possible to efficiently operate the automatic gain control loop irrespective of temperature variations.

As apparent from the above description, the present invention provides a temperature compensation device which is additionally provided in an automatic gain control loop of a receiver to adjust the gain of each component with temperature. The temperature compensation device is capable of, even though measured values of the strength of a received signal may differ with temperature variations, compensating for the temperature variations to accurately detect the received signal strength and accurately adjusting the gain of each component appropriately to the received signal strength. This is especially useful in systems that frequently adjust component gains, such direct conversion type systems.

Although the preferred embodiments of the present invention have been disclosed for illustrative purposes, those skilled in the art will appreciate that various modifications, additions and substitutions are possible, without departing from the scope and spirit of the invention, as disclosed in the accompanying claims.

What is claimed is:

1. A temperature compensation device for an automatic gain control loop in a receiver of a mobile communication terminal, comprising:

a thermistor having a resistance varying with temperature to vary an output voltage;

an analog/digital converter for converting the output voltage from said thermistor into a digital signal; and a temperature compensator for outputting a temperature compensation value in response to the digital signal based on a specific temperature variation, wherein said temperature compensator has a plurality of gain change threshold values corresponding respectively to various temperature variations, said temperature compensator outputting one of the gain change threshold values corresponding to said specific temperature variation as said temperature compensation value upon receiving said digital signal based on said specific temperature variation, and said temperature compensator is adapted to provide said gain change threshold value corresponding to said specific temperature variation to a gain determiner. said gain determiner determining a gain of each component of said receiver.

2. The temperature compensation device as set forth in claim 1, further comprising an adder for adding said temperature compensation value from said temperature compensator to a strength of a received signal in said receiver to correct an error in the received signal strength based on said specific temperature variation, and outputting the resulting accurate received signal strength.

* * * * *